United States Patent
Wang et al.

(10) Patent No.: US 6,564,354 B1
(45) Date of Patent: May 13, 2003

(54) METHOD FOR TRANSLATING CONDITIONAL EXPRESSIONS FROM A NON-VERILOG HARDWARE DESCRIPTION LANGUAGE TO VERILOG HARDWARE DESCRIPTION LANGUAGE WHILE PRESERVING STRUCTURE SUITABLE FOR LOGIC SYNTHESIS

(75) Inventors: Lanzhong Wang, Ft Collins, CO (US); Paul Donald Hylander, Plano, TX (US)

(73) Assignee: Hewlett Packard Development Company, L.P., Houston, TX (US)

( * ) Notice: Subject to any disclaimer, the term of this patent is extended or adjusted under 35 U.S.C. 154(b) by 447 days.

(21) Appl. No.: 09/586,167

(22) Filed: Jun. 1, 2000

(51) Int. Cl.$^7$ .................................................. G06F 17/50
(52) U.S. Cl. .................................................. 716/3; 716/1
(58) Field of Search ................ 716/3, 1; 717/136–161, 717/106–108, 114–119

(56) References Cited

U.S. PATENT DOCUMENTS 5,163,016 A  * 11/1992  Har'El et al. .................. 716/5
5,307,492 A  *  4/1994  Benson ......................... 717/159
5,339,238 A  *  8/1994  Benson ......................... 717/159
5,598,560 A  *  1/1997  Benson ......................... 717/159
5,842,017 A  * 11/1998  Hookway et al. ........... 717/158
5,875,334 A  *  2/1999  Chow et al. .................. 717/141

* cited by examiner

Primary Examiner—Vuthe Siek
Assistant Examiner—Brandon Bowers

(57) ABSTRACT

A methodology for translating conditional expressions of a non-Verilog hardware description language (HDL) program, not readily recognized by Verilog HDL, which can then be used to prove out a logic circuit design. IF/CASE/COND (ICC) expressions occurring within the HDL program that are not recognized by Verilog HDL are categorized and accordingly translated to IF/CASE statements in Verilog HDL syntax. For ICC expressions that are part of a conditional or binary operator expression, a globally incremental variable that is representative of a corresponding variable of an ICC expression is created for each variable of the ICC expression. The ICC expression is then assigned to the globally incremental variable(s) which is placed in an always statement that is recognized by Verilog HDL. Synthesis can then be performed on the always statement by a processor to generate a logic circuit representative of the module of the non-Verilog HDL program. Translation of other conditional expressions in the non-Verilog HDL program, including simple ICC expressions, nested ICC expressions, special expressions, and edge-triggered statements, can additionally be performed.

74 Claims, 9 Drawing Sheets

TO FIG. 8B

METHOD FOR TRANSLATING CONDITIONAL EXPRESSIONS FROM A NON-VERILOG HARDWARE DESCRIPTION LANGUAGE TO VERILOG HARDWARE DESCRIPTION LANGUAGE WHILE PRESERVING STRUCTURE SUITABLE FOR LOGIC SYNTHESIS

FIELD OF THE INVENTION

The presented invention relates generally to the use of hardware description languages to specify circuit logic design in a format that is acceptable to logic synthesis tools, and, more particularly, to a method for translating non-Verilog HDL containing conditional expressions to Verilog HDL format and syntax.

BACKGROUND OF THE INVENTION

The soundness of logic design of hardware such as complex central processor units (CPUs) must be tested prior to actually manufacturing the hardware. Logic design may be specified in the form of Boolean equations or a hardware description language (HDL) description in a language such as Verilog HDL, an IEEE standard hardware description language (IEEE Std 1364-1995). A routine can be written in an HDL such as Verilog HDL and then be converted into a logic gate circuit using a logical synthesis tool, such as Synopsys Design Compiler™, operating on a general-purpose computer. In this manner, the logic design can be proven out.

Verilog HDL, as an accepted standard, is a language accepted as an input format by many design tools available on the market today. A concern arises, therefore, when a hardware description language other than Verilog HDL is used, generically referred to as a non-Verilog HDL, since third party design tools that will accept Verilog HDL may not readily accept another HDL. Since it is desirable to increase design productivity and to thus shorten the design cycle of CPUs and other relevant hardware, it is important to leverage existing and advanced tools even if they do not accept the non-Verilog HDL. This requires that the non-Verilog HDL be translated into Verilog HDL so that it can be readily used with available tools. An important aspect of the translation into Verilog HDL is that the translation be logically correct; additionally, certain inherent semantics of the code must be preserved. Logic synthesis tools such as the Synopsys Design Compiler™ must be able to produce optimal results from the translated code.

A difficulty is encountered in the translation process when certain conditional expressions that are frequently used in the non-Verilog HDL are missing in Verilog HDL syntax and thus not recognized by the Verilog HDL. These conditional expressions may be broken into three types: IF expressions, CASE expressions, and COND expressions. An IF expression provides a choice between several expressions. The format of an IF expression is:

IF ifcond THEN exp1 ELSE exp2

A CASE expression returns the value of one expression out of N expressions, depending upon the value of a controlling expression. The format of a CASE expression is:

CASE caseexpr OF BEGIN
    [c1] exp1;
    [c2] exp2;
    .
    .
    .
    [cN] expN;
    [ ] expN+1;
  END;

A COND expression returns the value of one expression out of N expressions, depending on the value of the controlling expressions. The format of a COND expression is as follows:

COND BEGIN
    [sel_exp1] exp1;
    [sel_exp2] exp2;
    .
    .
    .
    [ ] expN+1;
  END;

These types of expressions (IF/CASE/COND) will be generically referred to as "ICC expressions" hereafter.

The approaches to translating the various types of ICC expressions into Verilog HDL each have problems. First, a possible solution is the use of a nested conditional operator "?:" in the translated expression to implement the logic of the ICC expression that was translated. Consider the following examples. An IF expression of a:=IF b THEN c ELSE d; can be translated to a=b ? c: d; and a CASE expression of:

a:=CASE caseExp OF BEGIN
    ['00] b;
    ['01] c;
    ['10] d;
    ['11] e;
    [ ] RETAIN;
  END;

can be translated to a=(caseExp==2'b00) ? b
    :(caseExp==2'b01) ? c
    :(caseExp==2'b10) ? d
    :(caseExp==2'b11) ? e
    a;

A COND expression is translated in a similar fashion to the CASE expression.

In the above translations of the IF and CASE expressions into Verilog, note the occurrence of the "?:" nested conditional operator. This approach to translating is simple and the generated Verilog HDL is clean and easy to read. Unfortunately, however, the performance of the generated Verilog code is very bad. What could be done with a single multiplexer in the pre-translated code is instead interpreted by logic synthesis tools as a multi-level chain of multiplexers in the translated code. This leads to very poor synthesis results as will be later described.

Second, ICC expressions of non-Verilog HDL code can be translated to Verilog "IF", "CASE" statements as shown below. Consider the same IF and COND expressions above. For the IF expression of a:=IF b THEN c ELSE d; the translation would be:

always @(b or c or d)
    if(b)
      a=c;
    else
      a=d;

The above CASE expression of:

a:=CASE caseExp OF BEGIN
    ['00] b;
    ['01] c;
    ['10] d;
    ['11] e;

```
    [ ] RETAIN;
  END;
can be translated to
  always @(caseExp or b or c or d or e)
  begin
    case (caseExp)
      2'b00: a=b;
      2'b01: a=c;
      2'b10: a=d;
      2'b11: a=e;
      default: a=a;
    endcase
```

This second approach overcomes the shortcoming of the first approach since synthesis tools can recognize that a CASE statement can be interpreted as a single multiplexer rather than a multiple-level chain of multiplexers. A high quality implementation can thus be generated from the translated Verilog code using this approach.

This solution, however, has a severe limitation because it only works for non-nested ICC(IF/CASE/COND) expressions. But since ICC expressions may occur anywhere within another expression and thus be nested, this approach is limited in its usefulness. Consider, for instance, the following expression containing a nested IF expression that cannot be readily translated using this second approach:

```
  a:=IF ( IF b THEN '010 ELSE '111)
     THEN d
     ELSE e;
```

Also, consider this additional example of an expression containing a nested ICC expression:

```
  a:=(IF(b) THEN c ELSE d) XOR COND BEGIN
    [sel_exp1] e;
    [sel_exp2] f;
    [sel_exp3] IF (g) THEN h ELSE i;
    [ ] j;
  END;
```

In both of these examples, there is no way to readily translate the code to Verilog IF/CASE statements and so the first approach, with its poor synthesis performance, must be used for code containing nested ICC expressions.

The properties associated with each of these two prior art approaches is best illustrated by example. Consider that the following is an example of a software module written in a non-Verilog HDL; note that the software module usually is written for the cell or block hardware level:

```
  fub mux;
  begin "mux"
    interface(
      input node in1[3:0];
      input node in2[3:0];
      input node in3[3:0];
      input node in4[3:0];
      input node in5[3:0];
      input node in6[3:0];
      input node in7[3:01];
      input node in8[3:0];
      input node sel[2:01];
      output node out[3:0];
    );
  structural main;
    begin "muxd4v main"
      out:=
      case sel of
      begin
        ['000] in1;
        ['001] in2;
        ['010] in3;
        ['011] in4;
        ['100] in5;
        ['101] in6;
        ['110] in7;
        ['111] in8;
      end;
    end "mux main";
  end "mux";
```

If this software module is translated to Verilog HDL with the first approach using the "?:" Verilog conditional operator, the result would be as follows:

```
  module mux(in1,in2,in3,in4,in5,in6,in7,in8,sel,out);
  input [3:0] in1;
  input [3:0] in2;
  input [3:0] in3;
  input [3:0] in4;
  Input [3:0] in5;
  input [3:0] in6;
  input [3:0] in7;
  input [3:0] in8;
  input [3:0] sel;
  output [3:0] out;
  reg [3:0] out;
  /* "muxd4v main" */
  always @(sel or in5 or in6 or in7 or in8 or in1 or in2 or
    in3 or in4)
  begin
    out=(sel==3'b000) ? in1
      :(sel==3'b001) ? in2
      :(sel==3'b010) ? in3
      :(sel==3'b011) ? in4
      :(sel==3'b100) ? in5
      :(sel==3'b101) ? in6
      :(sel==3'b110) ? in7
      :in8;
  end
  /* "muxd4v main" */
  endmodule
```

As previously mentioned, the performance of the generated Verilog code using this first approach is not good because logic synthesis tools interpret the code as multi-level chain of multiplexers. The synthesis result generated from the code by a logic synthesis tool such as the Synopsys Design Compiler™ after optimization is shown in FIG. 7. Since it can be seen that the critical path of FIG. 7 is still very long, a second optimization was preformed, the result of which is shown in FIG. 8. For purposes of illustration only, a timing and area analysis of FIGS. 7 and 8 revealed that the timing associated with FIG. 8 is approximately two times as fast as that associated with FIG. 7, but that the combinational area, or real estate, utilized by the optimization of FIG. 8 is almost five times greater than that of FIG. 7.

Now consider that the non-Verilog HDL module used in the above example is translated using the second approach of translating the non-Verilog HDL code to Verilog "If" and "Case" statements; the following code is achieved:

```
  module mux(in1,in2,in3,in4,in5,in6,in7,in8,sel,out);
  input [3:0] in1;
  input [3:0] in2;
```

```
input [3:0] in3;
input [3:0] in4;
input [3:0] in5;
input [3:0] in6;
input [3:0] in7;
input [3:0] in8;
input [2:0] sel;
output [3:0] out;
reg [3:0] out;
/* "muxd4v main" */
always @(sel or in5 or in6 or in7 or in8 or in1 or in2 or
    in3 or in4)
begin
case (sel) //synopsys Infer_13 mux
3'b000: out=in1;
3'b001: out=in2;
3'b010: out=in3;
3'b011: out=in4;
3'b100: out=in5;
3'b101: out=in6;
3'b110: out=in7;
3'b111: out=in8;
endcase
end
/* "muxd4v main" */
endmodule
```

The synthesis result generated from this translated code by a logic synthesis tool such as the Synopsys Design Compiler™ after optimization is shown in FIG. 9. A representative timing and area analysis of the optimization of FIG. 9 indicated that the timing associated with FIG. 9 is 3.6 times better than for FIG. 7. There is an improvement of 17% in area utilization over FIG. 7 and more than a 500% improvement in area utilization over the second optimization reflected in FIG. 8 for the same timing result.

From the above analysis, it is clear that there currently exists no translation approach in the art for readily translating non-Verilog HDL ICC expressions into Verilog HDL syntax in a manner that avoids the performance problems associated with the first, "?:" nested conditional operator translation approach and that can overcome the nested ICC expression limitation of the second translation approach. There is therefore an unmet need in the art to be able to readily and accurately translate all ICC conditional expressions occurring within non-Verilog HDL, including nested ICC expressions, to Verilog HDL in a manner that overcomes these problems and limitations while maintaining the Verilog HDL structure required for synthesis.

SUMMARY OF THE INVENTION

The present invention presents a method for translating conditional expressions of a non-Verilog hardware description language (HDL) program used to specify a logic design, that are not recognized by Verilog HDL. The methodology of the present invention may be implemented as executable computer program instructions of a computer readable medium that when executed by a processing system cause the processing system to translate non-Verilog conditional expressions to syntax recognized by Verilog HDL.

According to an embodiment of the invention, for each module of the non-Verilog containing one or more assign statements, which in turn have a plurality of IF/CASE/COND (ICC) expressions, a global link list that contains the plurality of IF/CASE/COND (ICC) expressions contained in the one or more assign statements is created; each ICC expression of the plurality of ICC expressions of the assign statement is characterized as having one or more variables. If an ICC expression of the plurality of ICC expressions contained within an assign statement of the assign statements is part of a conditional or binary operator expression, a globally incremental variable that is representative of a corresponding variable of the ICC expression is created. Next, the ICC expression is assigned to the globally incremental variable, thereby replacing the ICC expression with the globally incremental variable in the assign statement and in the global link list of the assign statement. Creating a globally incremental variable and replacing the ICC expression with the globally incremental variable is repeated for each variable within the ICC expression so as to generate one or more globally incremental variables in the assign statement and in the global link list that correspond to the one or more variables of the ICC expression. An always statement of the module, with an event expression having one or more members, that is representative of the assign statement and recognized by Verilog HDL is created by placing the one or more globally incremental variables contained within the global link list of the assign statement as the one or more members of the event expression. Synthesis can then be performed on the always statement by a processor to generate a logic circuit representative of the module of the non-Verilog HDL program. The above method can be performed for any or all modules of interest in the non-Verilog HDL program.

The above methodology can be expanded to address the concerns presented by other conditional expressions of concern in the non-Verilog HDL program, including simple ICC expressions, nested ICC expressions, special expressions and edge-triggered statements. If the ICC expression contained within the right hand side expression of an assign statement is determined to be a simple ICC expression, it is translated to an IF/CASE Verilog statement so that synthesis can be performed on it by a processor. For instance, for a simple IF expression, the left hand side expression of the assign statement is passed to the IF expression to create an IF Verilog statement. If the ICC expression is a simple CASE expression, the left hand side expression of the assign statement is passed to the CASE expression to create a CASE Verilog statement. If the ICC expression is a simple COND expression, the left hand side expression of the assign statement is passed to the COND expression and a special CASE Verilog statement is created from the COND expression. If the ICC expression is part of a conditional or binary operator expression, the methodology described above is employed. Moreover, if the ICC expression is nested within a principal ICC expression of the assign statement, the left hand side expression of the assign statement is passed to the ICC expression and then recursively passed to the principal ICC expression at a leaf level of the principal ICC expression of the assign statement. For a special ICC expression, the ICC expression is substituted with a Verilog-compatible expression that is assigned to the left hand side expression of the assign statement. Finally, if the assign statement in which the ICC expression is contained is an edge triggered assign statement, an edge triggered always statement in created into which the ICC expression is placed.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

The present invention provides an approach for translating non-Verilog HDL code into Verilog HDL code, with all the proper Verilog HDL syntax, even when the non-Verilog HDL code contains IF, CASE, or COND expressions or statements, both referred to herein as ICC expressions. This represents a significant improvement because, as previously discussed, Verilog HDL will only recognize IF and CASE statements and has no COND syntax at all. The use of the Verilog HDL nested conditional operator "?:" is completely avoided to achieve good synthesis results of the resulting translated code. All ICC expressions of the non-Verilog HDL, including COND statements or expressions, are translated into IF or CASE statement format that is readily understood as Verilog HDL syntax as will now be described. The present invention is applicable to any non-Verilog HDL having ICC expressions that must be readily and easily translated into Verilog HDL. Moreover, the methodology of the present invention may be implemented by a computer program of a computer-readable medium.

Figure 1:
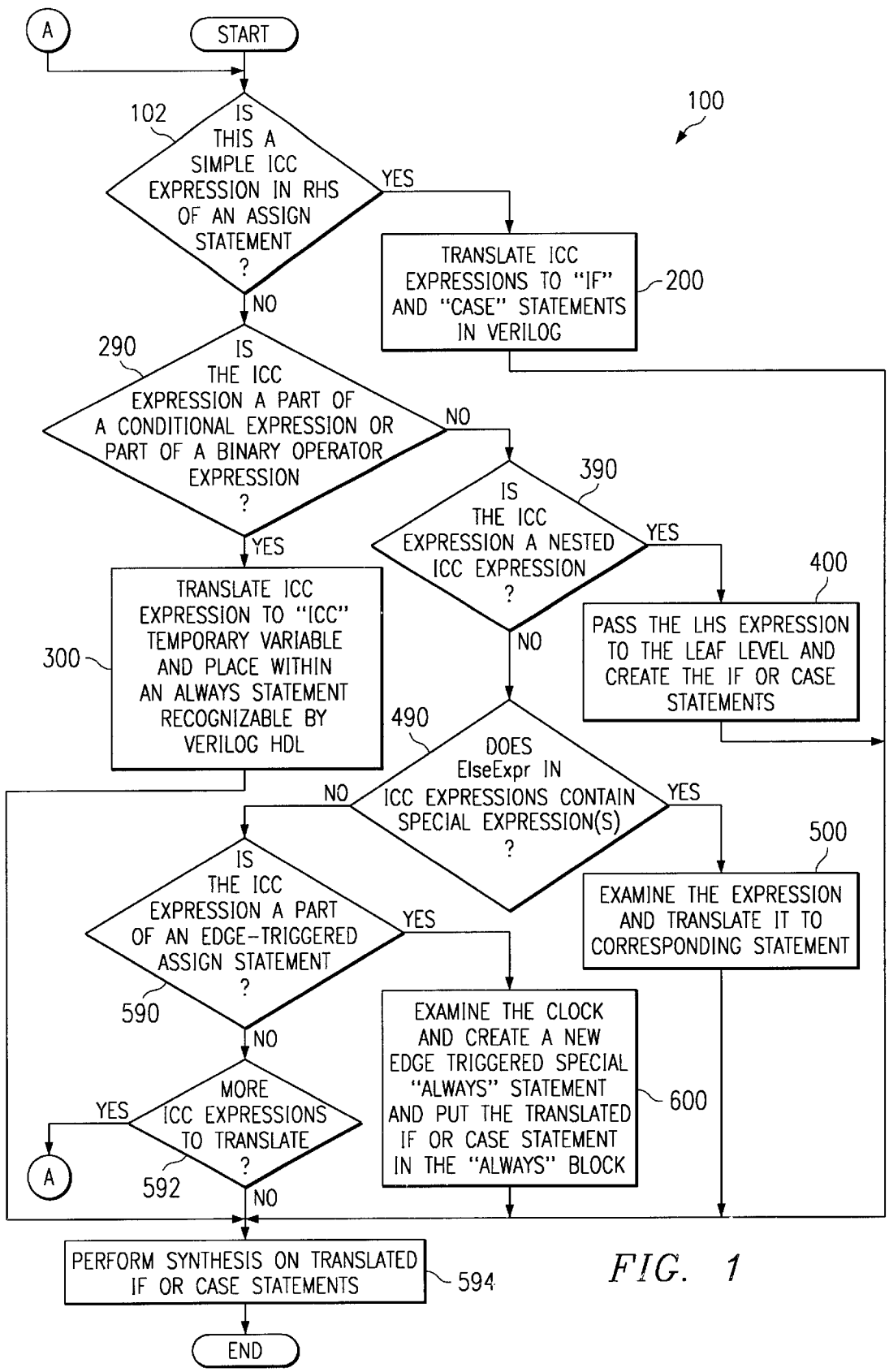
FIG. 1 illustrates an overall flow of a method for translating non-Verilog HDL conditional expressions occurring in a non-Verilog HDL program to recognizable IF and CASE Verilog HDL syntax, in accordance with the present invention.

Referring to FIG. 1, an overall flow 100 of a method of translating conditional expressions occurring in a non-Verilog HDL program, containing ICC expressions not recognized as Verilog HDL syntax and used to specify a logic circuit design of interest, in accordance with the present invention is disclosed. The questions posed by Decision Blocks 102, 290, 390, 490, and 590 are generally modularly, meaning that they can be performed in the order shown or in a different order without departing from the spirit and scope of the invention. Additionally, as indicated by Decision Block 592, this flow, or portions of this flow, is performed for each ICC expression of interest in the non-Verilog HDL program.

At Decision Block 102, the first inquiry is whether the ICC expression of interest is a so-called "simple" expression located in the right hand side (RHS) of an assign statement of a module of the non-Verilog HDL program. The module level of code is typically representative of the cell level or block level in hardware of the logic circuit being analyzed. The module will have one or more assign statements, with each assign statement having one or more ICC expressions; the non-Verilog HDL program thus will have a plurality of ICC expressions. The simple ICC expression will not be a part of, i.e. a subset of, a conditional or binary operator expression, will not be nested within another ICC expression, will not be a "special" expression (described below), and will not be part of an edge-triggered assign statement. Rather, the simple ICC expression will be none of these, instead being a straightforward IF, CASE, or COND expression, such as this simple IF expression, for example:

q:=IF(a) THEN b ELSE c;

If the ICC expression is a simple ICC expression, then it is translated to Verilog IF and CASE statements in accordance with the methodology 200 illustrated in FIG. 2, described in more detail below.

If the ICC expression is not a simple ICC expression, then its true nature is ascertained by going through the remaining decision blocks. At Decision Block 196, the inquiry is whether the ICC expression is part of a conditional expression or part of a binary operator expression. An example of the ICC expression as part of an IF conditional expression is:

IF(IF(a) THEN b ELSE c)

while an example of the ICC expression as part of an "AND" binary operator expression is:

a AND CASE(a) OF BEGIN

. . .

Figure 3:
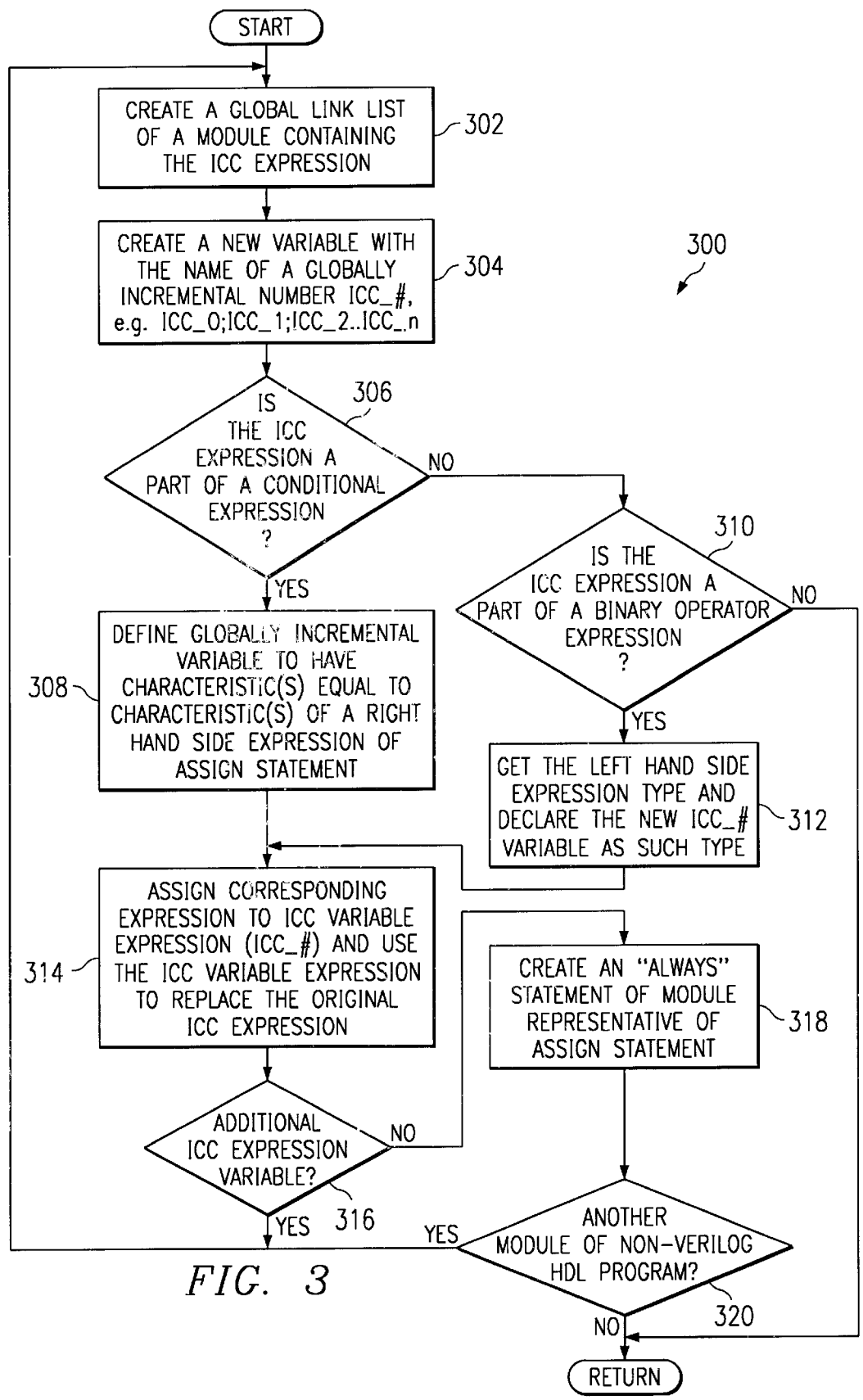
FIG. 3 illustrates a flow for translating ICC expressions that are part of a conditional or binary operator expression, in accordance with the present invention.

END;

If the ICC expression is part of a conditional or binary operator expression, then the flow goes to FIG. 3, flow 300, in which the ICC expression is translated to an ICC temporary, globally incremental variable, denoted by ICC_# in which # denotes a number assigned to a particular variable of the ICC expression, that is placed into a special always statement that is recognizable by Verilog HDL.

If the ICC expression is not part of a conditional or binary operator expression, then the inquiry is whether the ICC expression of interest is a "nested ICC expression" that is nested within another, primary ICC expression. An example of a nested ICC expression is given by the following in which a CASE ICC expression is nested within an IF, primary expression:

q:=IF(b) THEN

CASE(a) OF BEGIN

['00] c;

['01] d;

['10] e;

['11] IF(f) THEN g ELSE h;

[] RETAIN;;

END;

ELSE

Figure 4:
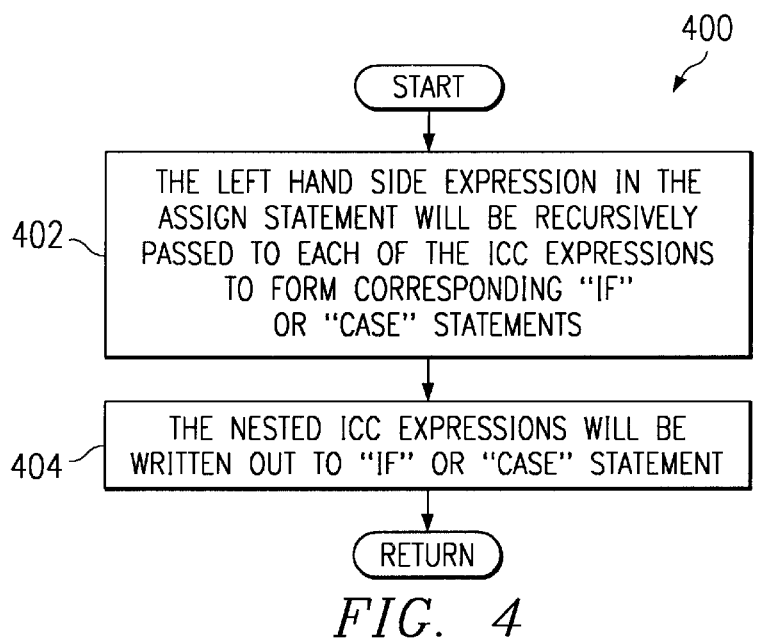
FIG. 4 illustrates a flow for translating nested ICC expressions, in accordance with the present invention.

RETAIN;

Note also the use of the RETAIN special expression in this example. If the ICC expression is nested within a primary ICC expression, then, as illustrated in the flow 400 of FIG. 4, the left hand side (LHS) expression of the assign statement in which the nested ICC expression is part of the RHS expression is passed to the leaf level of the nested ICC expression and a recognizable Verilog HDL IF or CASE expression is created. If the ICC expression is not a nested ICC expression, then at Decision Block 490 the inquiry is whether the ICC expression contains a "special expression," such as NODRIVE, RETAIN, PRECHARGE, WEAKPULL, and SUSTAIN, for instance. If the ICC expression does contain a special expression, the flow goes to the flowchart 500 of FIG. 5 in which the special expression of the ICC expression is translated to a Verilog HDL-readable expression.

Figure 6:
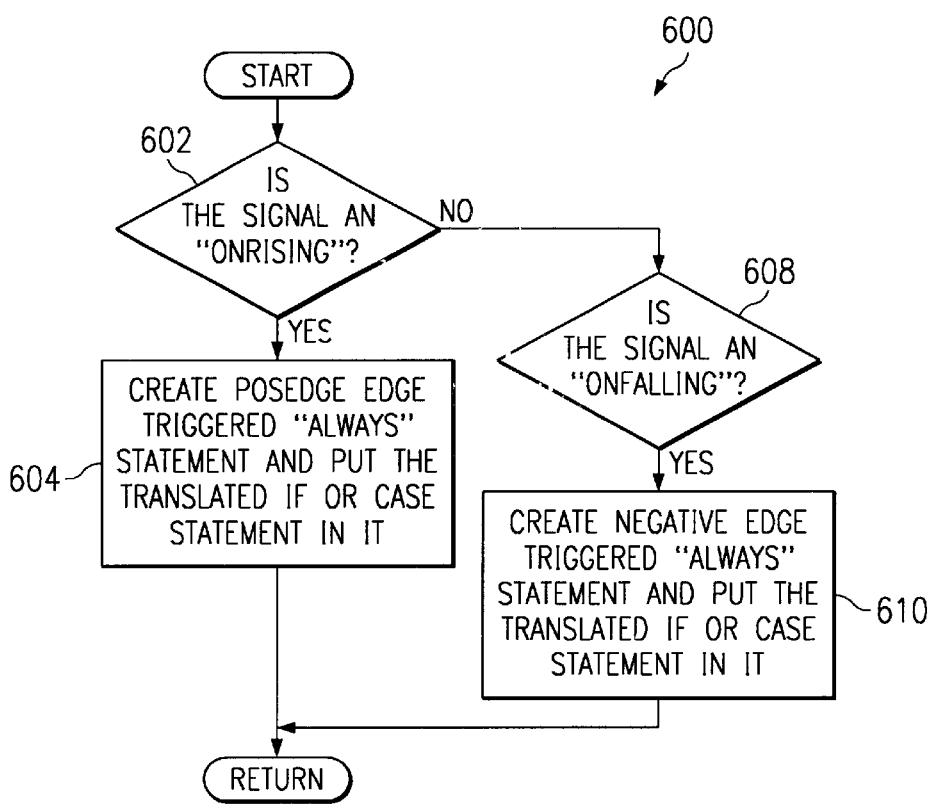
FIG. 6 illustrates a flow for translating edge-triggered assign statements, in accordance with the present invention.

If the ICC expression does not contain a special expression, then at Decision Block 590, the inquiry is whether the ICC expression is part of an edge-triggered assign statement. If so, then the clock signal of interest to the logic circuit with which the ICC expression is concerned is exampled to create an appropriate edge-triggered always statement into which a translated IF or CASE Verilog-recognizable statement is placed, as described in the flow 600 of FIG. 6. An example of an edge-triggered assign statement is as follows:

q:=IF(a) THEN b ELSE c ON RISING clk;

Again, determining the type of ICC expression and translating it accordingly is performed for every ICC expression of interest in the non-Verilog HDL program, as ensured by Decision Block 592. Finally, at Block 594 synthesis of the translated Verilog-recognizable IF or CASE statements is performed by a logic synthesis tools to test out the logic circuit design represented by the non-Verilog HDL. It is noted that synthesis of the translated IF or CASE statements may occur after all of the ICC expressions have been translated or it may occur as each ICC expression is translated.

Figure 2:
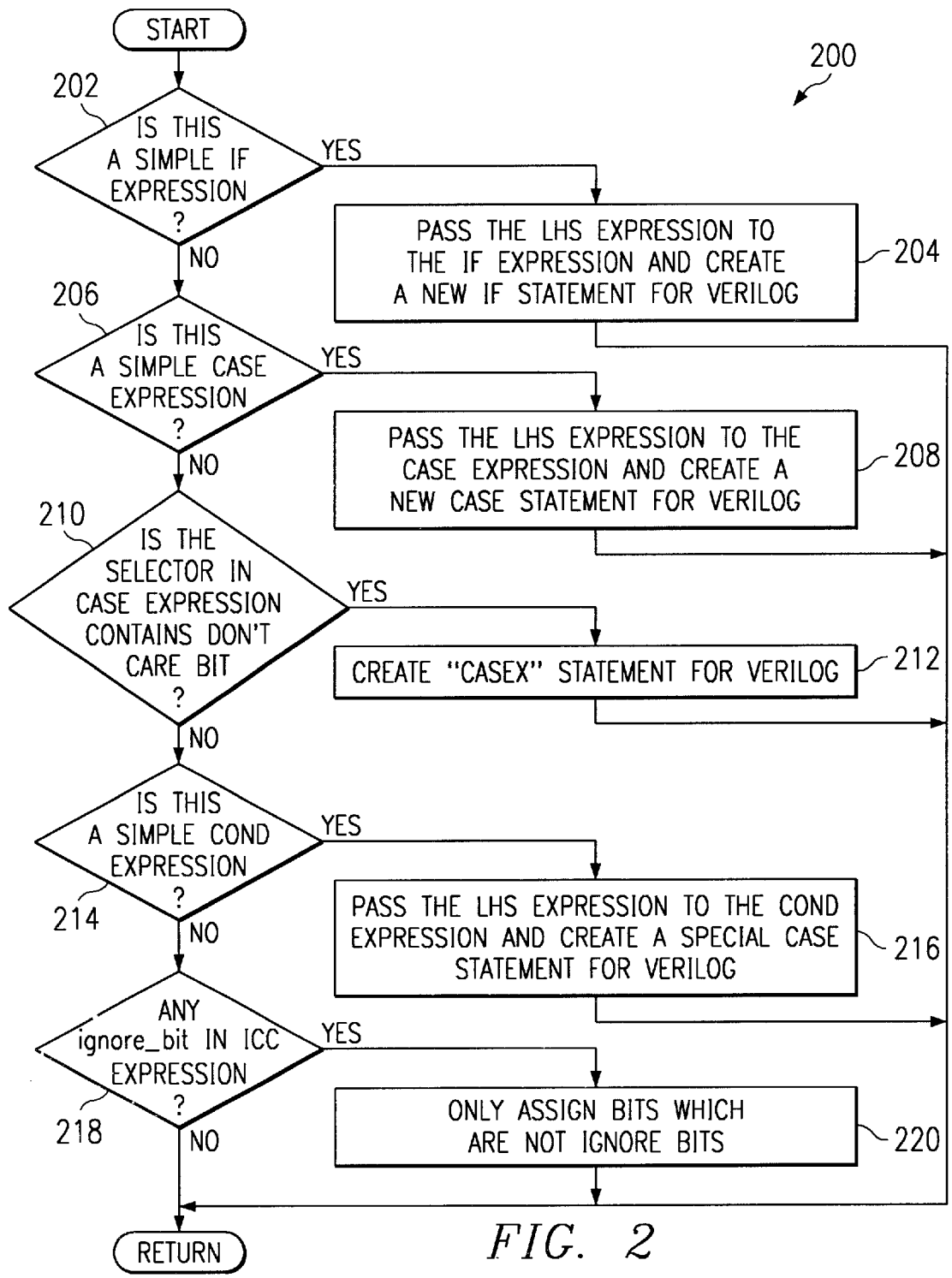
FIG. 2 illustrates a flow for the translation of simple ICC expressions to Verilog IF and CASE statements, in accordance with the present invention.

Of particular interest in the present invention is the translation of simple ICC expressions, especially COND expressions, to Verilog syntax, illustrated in FIG. 2, and the translation of ICC expressions that are part of conditional or binary operator expressions, illustrated in FIG. 3.

Referring now to FIG. 2, once the ICC expression of interest has been found to be a "simple ICC expression" at Decision Block 102, discussed above, a method 200 for translating the simple ICC expression is disclosed. If the ICC expression is a simple ICC expression in the right hand side expression of the assign statement, the ICC expression is translated to either an IF or a CASE Verilog statement, called an IF/CASE Verilog statement. Synthesis of the translated IF/CASE Verilog statement can then be performed by a processor at any desired time, such as when all of the ICC expressions of the non-Verilog DHL program have been translated or immediately.

As indicated in FIG. 2, translating a simple ICC expression to an IF/CASE Verilog statement depends upon what type of expression the simple ICC expression is. It is understood that the particular order in which the decision blocks of FIG. 2 are performed may be changed without departing from the spirit and scope of the invention. At Decision Block 202, if the simple ICC expression is a simple IF expression, then the left hand side expression of the assign statement is passed to the IF expression to create an IF Verilog statement. Thus, the following simple IF expression:

q:=IF(a) THEN b ELSE c;

is translated to:

if(a) q=b;
else
q=c;

Following the translation of Block 204, the flow returns to FIG. 1. If the simple ICC expression is not a simple IF expression, it must be determined whether it is a simple CASE expression or a simple COND expression. At Decision Block 206, the inquiry is whether the simple ICC expression is a simple CASE expression. If so, then at Block 208 the left hand side expression of the assign statement is passed to the CASE expression to create a CASE Verilog statement. For example, the following simple CASE expression:

q:=CASE a OF BEGIN
[b] c;
[na][wr32] '1;
[x1 TO x3] '0;
[ ] '0;
END;

is translated as:

case (a)
b:q=c;
na|wr32:
q=1'b1;
x1|x2|x3:
q=1'b0;
default:
q=1'b0;
endcase

After the translation activity of Block 208, the flow returns to FIG. 1. As indicated at optional Decision Block 210 (indicated as optional by the dashed lines), if a selector of the CASE expression contains a don't care bit, usually denoted by "?", then a casex Verilog statement is created. casex is a recognized Verilog syntax. Thus, the following CASE expression containing don't care bits:

q:=CASE a OF BEGIN
['?1] b;
['1?] c;
END;

is translated to the following casex statement, recognizable by Verilog:

casex (a)
2'b?1:b;
2'b1?:c;
endcase

After the casex statement is created at Block 212, the flow returns to FIG. 1.

At Decision Block 214, the inquiry is whether the simple ICC expression is a simple COND expression. If so, then at Block 216 the left hand side expression of the assign statement is passed to the COND expression and a special CASE Verilog statement is created from the COND expression. Thus, the following simple COND expression:

q:=COND BEGIN
[reset] '01;
[ph1 AND load] '10;
[ ]b[4:3];
END;

is translated as follows:

case (1'b1)
reset: q=2'b01;
ph1 & load: q=2'b10;
default: q=b[4:3];
endcase

After the translation of Block 216 is completed, the flow returns to FIG. 1.

Finally, as indicated by Decision Block 218 and Block 220, any ignore bits contained within the simple ICC expression are not assigned to the translated expression; only bits that are not ignore bits are assigned in the translated statement. Thus, the following ICC expression containing two ignore bits, indicated by "_":

q:=IF a THEN b ELSE '_1_0;

is translated as follows:

if (a) q=b;
else begin
q[3]=1'b1;
q[0]=1'b0;
end;

After completing the activity of Block 220, the returns to FIG. 1. If, at Decision Block 218, the ICC expression does not contain any ignore bits within it, the flow returns to FIG. 1.

Referring again to FIG. 1, at Decision Block 290 the inquiry is whether the ICC expression is part of a conditional expression or a binary operation expression. If so, then the flow continues to Block 300 where the ICC expression is translated to a temporary, globally incremental variable and placed within an always statement that is recognizable by Verilog HDL. The details of Block 300 are shown in FIG. 3.

At Block 302, a global link list of a module of the non-Verilog HDL program is created. The module contains the assign statement having the ICC expression as well as possibly other assign statements having their own assign statements. The link list contains all of the ICC expressions found in the assign statements of the module. Each ICC expression of the non-Verilog HDL program has one or more variables within the expression that will be replaced with a created globally incremental number. Next, at Block 304 a new variable with the name of a globally incremental number, ICC_#, is created. The globally incremental variable is representative of a corresponding variable of the ICC expression. If the ICC expression contains more than one variable, then a globally incremental variable is created for each variable of the ICC expression, e.g. ICC_0; ICC_1; ICC_2; . . . ; ICC_n are created for an ICC expression containing n variables.

The next thing in the process is to assign the ICC expression to the globally incremental variable or variables that have been created for the expression. The ICC expression is then replaced by the globally incremental variable or variables in the assign statement and in the global link list of the assign statement. This occurs in Blocks 306–312 of the flow; thus, whether the ICC expression is part of a conditional expression or a binary operator expression must be determined. At Decision Block 306, the inquiry is whether the ICC expression is part of a conditional expression. If so, then at Block 308 the globally incremental variable is defined to have one or more characteristics, such as width and type, that are equal to one or more characteristics of the right hand side expression of the assign statement. For an IF ICC expression, this will include going down to the IfExpr and ElseExpr in the IF expression to define the globally incremental variable. For a CASE or COND ICC expression, this will mean going to the CASE/COND Expr list to find out the expression type and accordingly defining the globally incremental variable. For example, for NODE STATE b[3:0] (for which the translated variable will be reg b[3:0]; of the assign statement q:=IF(IF(a) THEN b ELSE c) THEN d ELSE e; the globally incremental variable ICC_# for the (IF(a) THEN b ELSE c) conditional expression will be the same as b: reg ICC_0[3:0];

If the ICC expression is not part of a conditional expression but is instead part of a binary operator expression, as determined at Decision Block 310, then the globally incremental variable is defined to have one or more characteristics that are equal to one or more characteristics of the left hand side expression of the assign statement at Block 312. Again, these characteristics may include the width and type of the left hand side expression. If the ICC expression is not part of either a conditional expression or part of a binary operator expression, then the flow returns to FIG. 1. Next, the ICC expression, whether part of a conditional expression or part of a binary operator expression, is assigned to the globally incremental variable and the globally incremental variable replaces the ICC expression in the assign statement and in the global link list of the assign statement at Block 314. In the case of the ICC expression as part of a conditional expression, for instance, the translation may look thus:

q:=IF(IF(a) THEN b ELSE c) THEN d ELSE e;

is translated to:

if(a) ICC_0=b;
else
ICC_0=c;
if (ICC_0) q=d;
else
q=e;

The translation of an ICC expression as part of a binary operator expression is demonstrated by the following. The ICC expression:

q:=a XOR (CASE b OF BEGIN
['0] c;
['1] d;
END;)

is translated to:

case (b)
[1'b1]: ICC_1=c;
[1'b0] ICC_1=b;
endcase
q=a ^ ICC_1;

Decision Block 316 ensures that the process detailed in Blocks 304–314 is repeated for each variable contained within the ICC expression in order to generate one or more globally incremental variables in the assign statement and in the global link list that correspond to the one or more variables of the ICC expression.

At Block 318, an always statement of the module that is representative of the assign statement, and recognized by Verilog HDL, is created by placing the one or more globally incremental variables contained within the global link list of the assign statement as the one or more members of the event expression of the always statement. As is known in IEEE syntax, the event expression of an always statement is an event identifier, such as a posedge expression or a negedge expression. Following are two such always statements, one for an IF ICC statement and the other for a CASE ICC statement:

always @(a or b or c or ICC_0 or d or e) begin
if(a) ICC_0=b;
else
ICC_0=c;
if (ICC_0) q=d;
else
q=e;
end
always @(a or b or c or ICC_1) begin
case (b)
[1'b1]: ICC_1=c;

[1'b0] ICC_1=b;
endcase
q=a ^ ICC_1;
end

Decision Block 320 ensures that Blocks 302–318 is repeated for each module of interest in order to create a plurality of always statements, one for each module of the plurality of modules of the non-Verilog HDL program, that are recognized by Verilog HDL. Following completion of the flow of FIG. 3, the process returns to FIG. 1 where synthesis can be performed on the plurality of always statements by the processor to generate a logic circuit representative of the modules of the non-Verilog HDL program.

Figure 5:
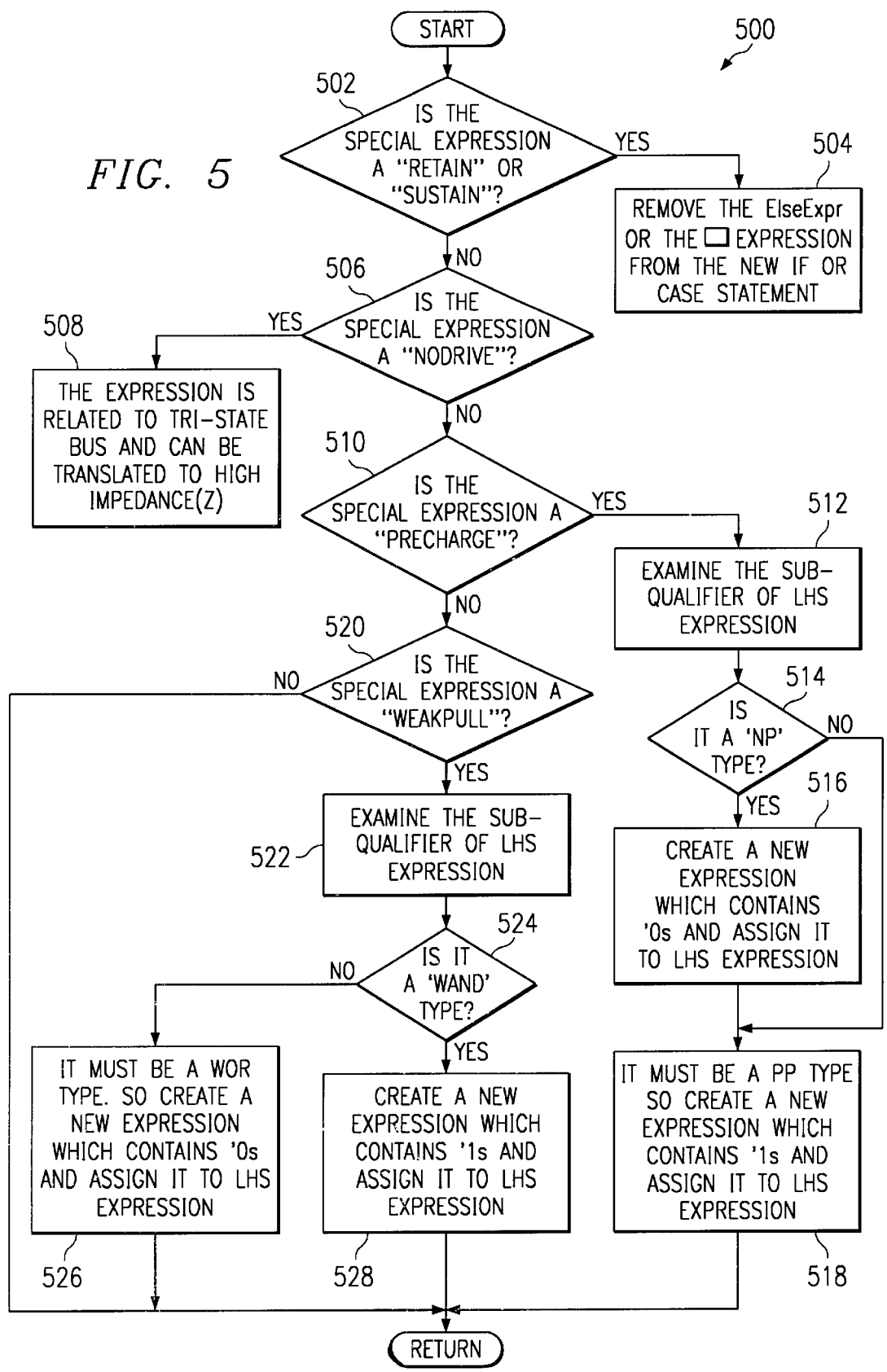
FIG. 5 illustrates a flow for translating special ICC expressions, in accordance with the present invention.
Figure 7:
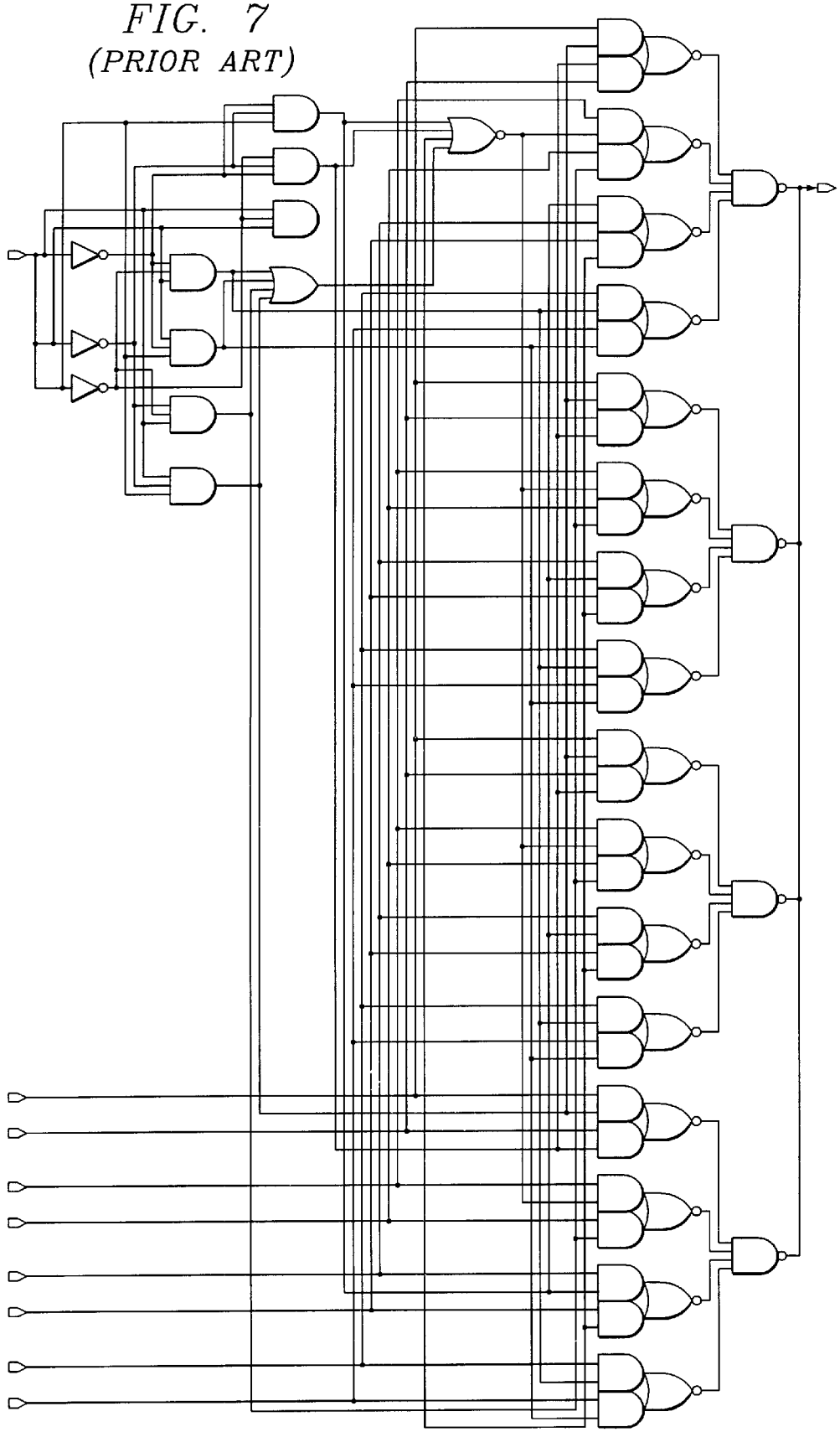
FIGS. 7–9 illustrate synthesis results generated from various translated code by a logic synthesis tool such as the Synopsys Design Compiler™ after optimization.
Figure 8A:
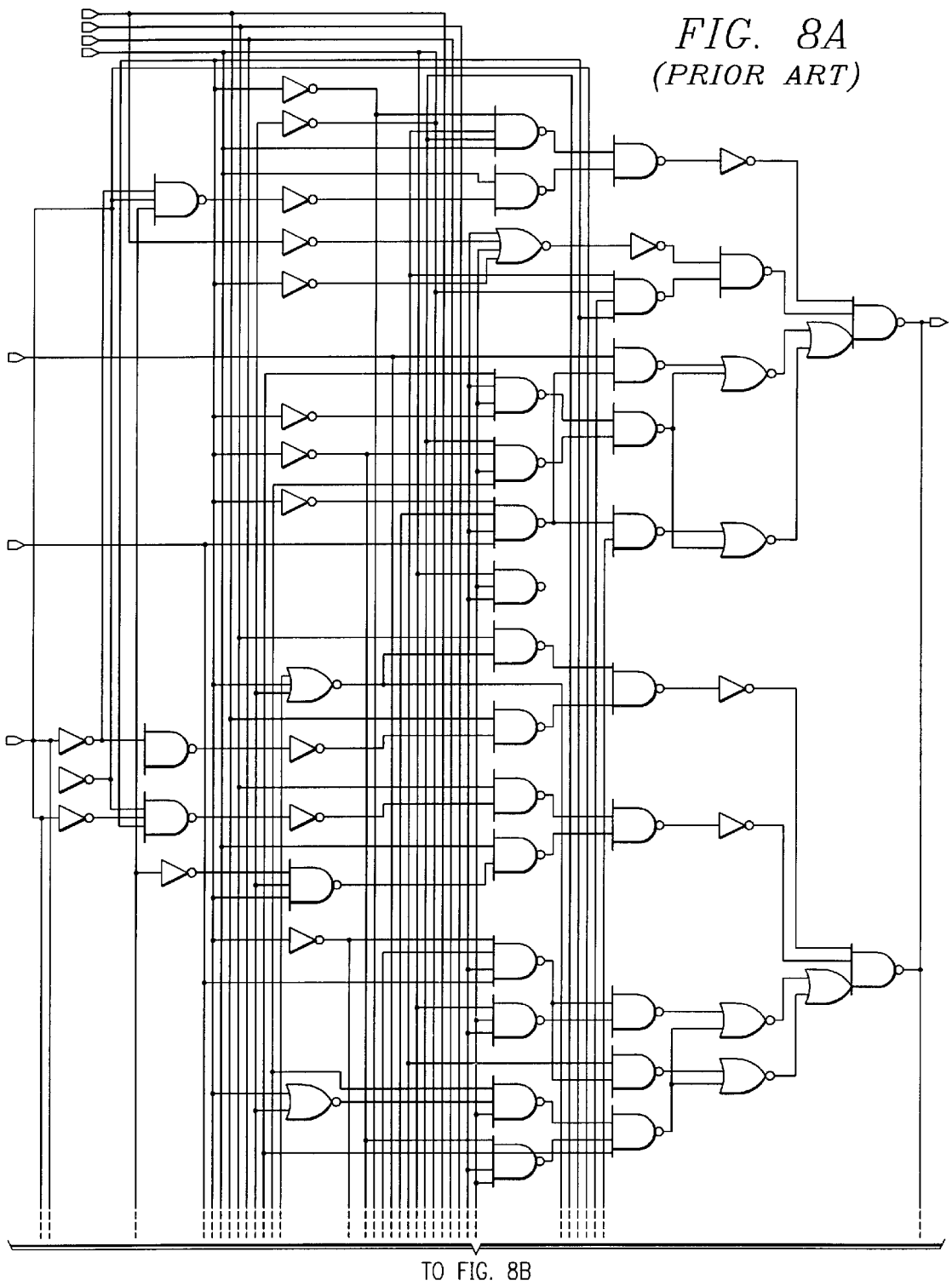
Figure 8B:
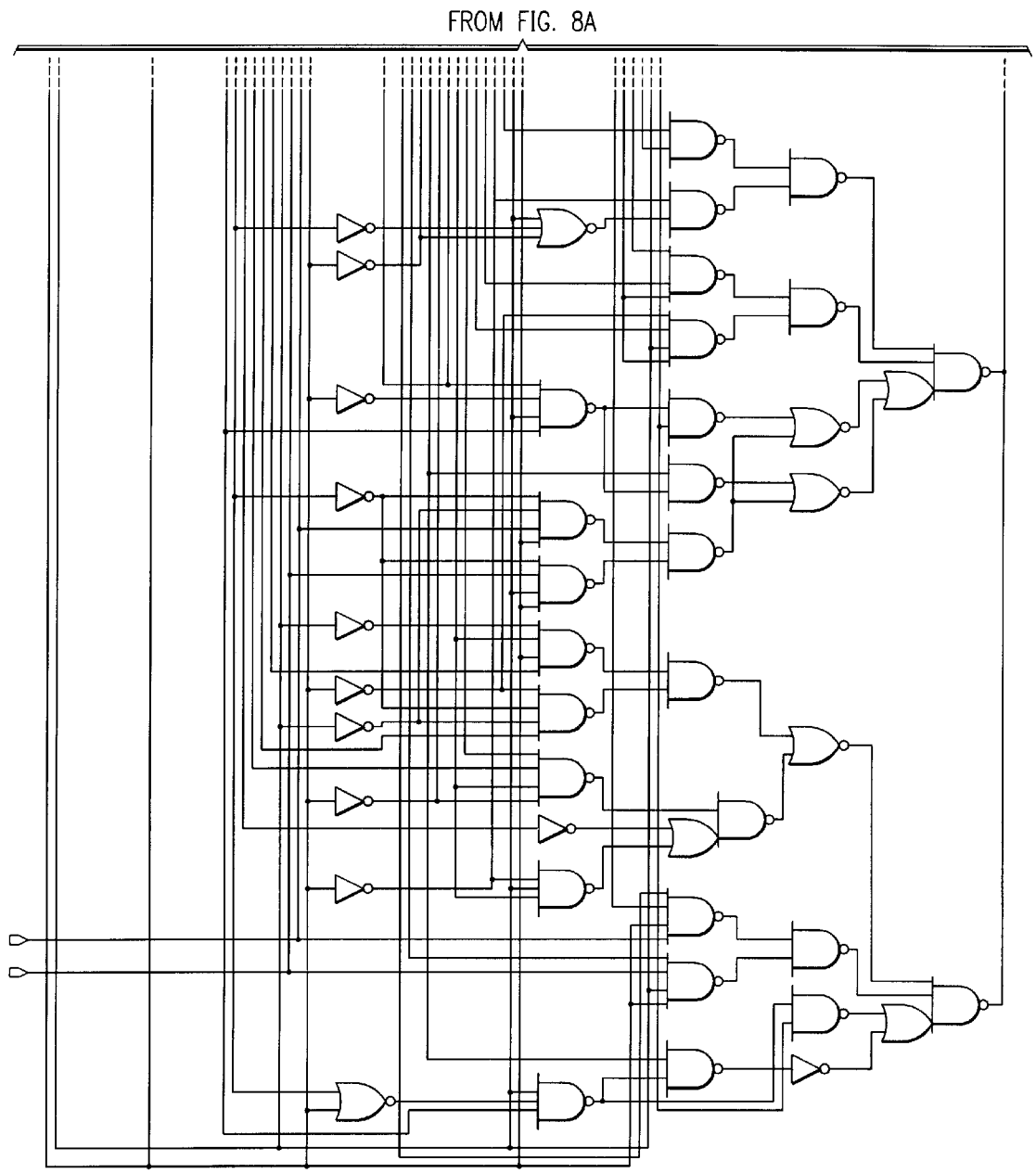
Figure 9:
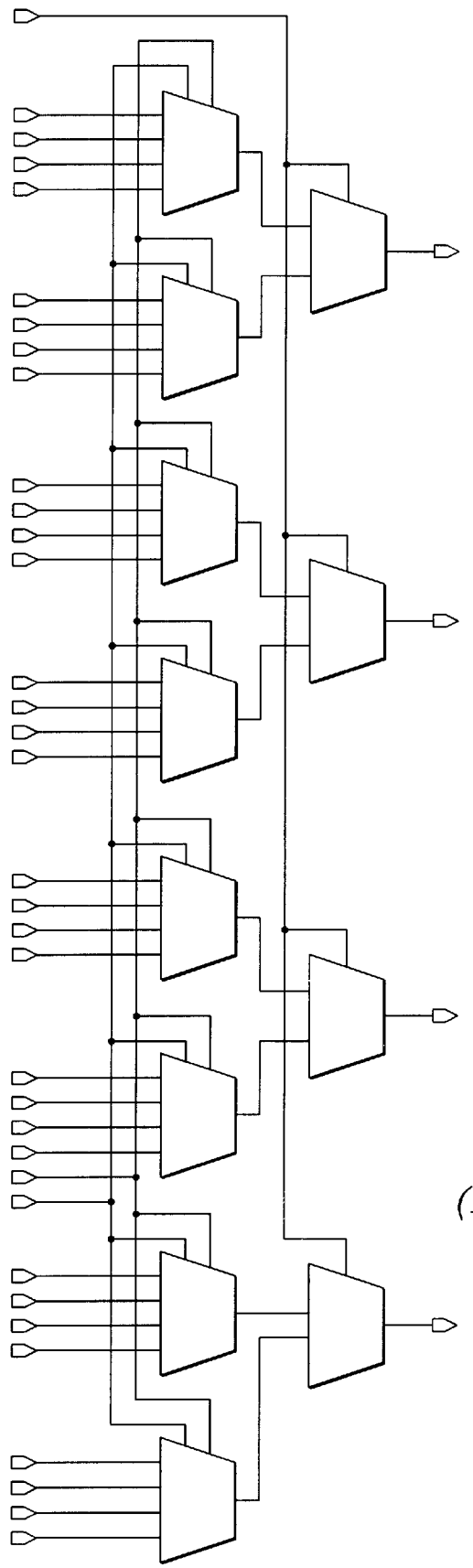

Referring back to FIG. 1, the situation where the ICC expression of interest is a nested expression is considered. At Decision Block 390, the flow is directed to flow 400 of FIG. 4 if the ICC expression is a nested ICC expression to recursively pass the left hand side expression of the assign statement to the leaf level (variable level) of statement and create the IF and/or CASE statements that are recognized by Verilog HDL. The nested ICC expression is considered nested, or within, a principal ICC expression. As shown at Block 402, the left hand side expression is recursively passed to each of the ICC expressions within the statement until the leaf level is reached to form corresponding IF and CASE statements at Block 404. This involves passing the left hand side expression of the assign statement to the nested expression and then recursively passing it to the principal ICC expression at a leaf level of the principal ICC expression of the assign statement. For example, the following assign statement contains a nested ICC expression:

q:=IF(a) THEN
CASE(b) OF BEGIN
['00] c;
['01] d;
['10] e;
['11] IF(f) THEN g ELSE h;
[ ] RETAIN;
END:
ELSE
RETAIN;
is translated to:
if(a)
case (b)
2'b00: q=c;
2'b01: q=d;
2'b10: q=e;
2'b11: if(f) q=g;
else
q=h;

The RETAIN expression is a special expression discussed in FIG. 5.

The next inquiry in FIG. 1 is whether the ICC expression is a so-called "special expression" within the non-Verilog HDL that requires special treatment during translation in order to be recognized by Verilog HDL. Generally, the special ICC expression is substituted with a Verilog-compatible expression that is assigned to a left hand side expression of the assign statement. The types of special expressions are varied and depend to some extent on the particularities of the non-Verilog HDL being used. Flow 500 of FIG. 5, for illustration purposes only, contains four such special expressions. Again, the order in which the Decision Blocks of FIG. 5 are executed is not a great import to the invention.

At Decision Block 502, if the ICC expression is a "RETAIN" or "SUSTAIN" expression, meaning that the state of a node of the logic circuit being analyzed is to be static and unchanging, then the conditional portion of the ICC statement is deleted in the translation. For instance, the ICC expression:

q:=IF (A) THEN b ELSE RETAIN;
is translated to:
if(a)
q=b;

If the ICC is a "NODRIVE" special expression, as determined at Decision Block 506, for instance, this indicates that the expression is related to the circuit Tri-State bus and can thus be translated as a high impedance Z expression at Block 508. The bitwidth of the high impedance expression should match the bitwidth of the left hand side expression. For example, the following NODRIVE special expression:

q[7:0]:=CASE (a) OF BEGIN
[c] d;
. . .
[ ] NODRIVE;
END;
is translated as:
case(a)
c: q[7:0] =d;
default: q[7:0]=8'bzzzzzzzz;
endcase Now consider that the ICC is a PRECHARGE special expression, determined at Decision Block 510. In this instance, the predefined bus class of the expression, either Negative Precharge (NP) or Positive Precharge (PP), is determined by looking to the sub-qualifier of the left hand side expression of the assign statement. If the PRECHARGE expression is an NP type, determined at Decision Block 514, then a new expression containing 0's is created and assigned to the left hand side expression. For instance, the following NP PRECHARGE special expression:

NODE BUS NP q[3:0];
. . .
q:=IF(a) THEN b ELSE PRECHARGE;
is translated to:
trireg q[3:0];
. . .
if(a) q=b;
else q=4'b0000;

If, however, the expression is a PP PRECHARGE special expression, then the newly created expression will contain 1's and be assigned to the left hand side expression. For instance, the following PP PRECHARGE expression:

NODE BUS PP q[3:0];
. . .
q=IF(a) THEN b ELSE PRECHARGE;
is translated as:
trireg q[3:0];
if(a) q=b;
else q=4'b1111;

Another example of a special expression is the WEAK-PULL special expression, treated at Blocks 520–528 of FIG. 5. At Block 522, the sub-qualifier of the LHS expression of the assign statement is investigated to determine the type of WEAKPULL expression, either WiredAND (WAND) or WiredOR (WOR). If the WEAKPULL expression is a WAND type, determined at Decision Block 524, a new expression containing 1's is created at Block 528. If, however, the WEAKPULL expression is of the WOR type, the new expression will contain 0's as shown at Block 526. Consider the examples of translation of WEAKPULL special expressions. The first WEAKPULL special expression is a WAND type:

NODE BUS WAND q[3:0];
. . .
q:=IF(a) THEN b ELSE WEAKPULL;

and is translated to:

wand q[3:0];
. . .
if(a) q=b;
else q=4'b1111;

Following is an example of a second WEAKPULL special expression of the WOR type:

NODE BUS WOR q[3:0];
. . .
q:=IF(a) THEN b ELSE WEAKPULL;

which is translated to:

wor q[3:0];
. . .
if(a) q=b;
else q=4'b0000;

Following scrutiny of the ICC expression for various types of special expressions in FIG. 5, only a few of which are shown here for purposes of illustration only, the flow returns to FIG. 1.

Referring back to FIG. 1, Decision Block 590 inquires whether the ICC expression of interest is part of an edge-triggered assign statement, such as: q:=IF(a) THEN b ELSE c ON RISING clk; If so, then the flow continues to flow 600 of FIG. 6 to create an edge-triggered always statement into which the ICC expression is placed, taking into account the clock signal of the circuit being investigated. At Decision Blocks 602 and 608, the inquiry is whether the clock signal is either a positive edge triggered or a negative edge triggered clock. If the clock signal is positive edge triggered (rising clock), then a positive edge triggered always statement is created into which the translated IF/CASE Verilog statement is placed, at Block 604. Consider the following example of a rising clock ICC expression:

q=IF(a) THEN b ELSE c on RISING clk;

which is translated to:

always @(posedge clk) begin
if(a)
q=b;
else
q=c;
end

If, however, the clock signal is negative edge triggered (falling clock), then a negative edge triggered always statement is created into which the translated IF/CASE Verilog statement is placed, at Block 610. For example, the following falling clock ICC expression:

q:=CASE (a) OF BEGIN
[b] c;
[d] e;
[f] g;
[ ] h;
END
ONFALLING clk;

is translated as follows:

always @(negedge clk) begin
case (a)
b: q=c;
d: q=e;
f: q=g;
default: q=h;
endcase
end While the invention has been particularly shown and described with reference to a preferred embodiment, it will be understood by those skilled in the art that various changes in form and detail may be made therein without departing from the spirit and scope of the invention.

What is claimed is:

1. A method of translating conditional expressions, of a non-Verilog hardware description language (HDL) program used to specify a logic design, that are not recognized by Verilog HDL, comprising:

a) for a module of the non-Verilog HDL program containing one or more assign statements having a plurality of IF/CASE/COND (ICC) expressions, creating a global link list that contains the plurality of IF/CASE/COND (ICC) expressions contained in the one or more assign statements, with each ICC expression of the plurality of ICC expressions of the assign statement having one or more variables;

b) if an ICC expression of the plurality of ICC expressions contained within an assign statement of the plurality of assign statements is part of a conditional or binary operator expression, creating a globally incremental variable that is representative of a corresponding variable of the ICC expression;

c) assigning the ICC expression to the globally incremental variable and replacing the ICC expression with the globally incremental variable in the assign statement and in the global link list of the assign statement;

d) repeating b)–c) for each variable of the one or more variables of the ICC expression to generate one or more globally incremental variables in the assign statement and in the global link list that correspond to the one or more variables of the ICC expression;

e) creating an always statement of the module, with an event expression having one or more members, that is representative of the assign statement and recognized by Verilog HDL by placing the one or more globally incremental variables contained within the global link list of the assign statement as the one or more members of the event expression; and f) performing synthesis on the always statement by a processor to generate a logic circuit representative of the module of the non-Verilog HDL program.

2. The method of claim 1, wherein creating the globally incremental variable that is representative of the corresponding variable of the ICC expression, further comprises:

b1) if the ICC expression is part of a conditional expression, defining the globally incremental variable to have one or more characteristics that are equal to one or more characteristics of the corresponding variable; and b2) if the ICC expression is part of a binary operation expression, defining the globally incremental variable to have one or more characteristics that are equal to one or more characteristics of a left hand side expression of the assign statement.

3. The method of claim 2, wherein the one or more characteristics of the corresponding variable of the ICC expression include a width and a type.

4. The method of claim 2, wherein defining the globally incremental variable further comprises:

determining the one or more characteristics of the corresponding variable by looking at a leaf level of the conditional expression that contains the corresponding variable; and setting the one or more characteristics of the globally incremental variable to be equal to the one or more characteristics of the right hand side of the conditional expression.

5. The method of claim 4, wherein the one or more characteristics of the globally incremental variable include a width and a type.

6. The method of claim 2, wherein the one or more characteristics of the left hand side expression of the binary operation expression include a width and a type and the one or more characteristics of the globally incremental variable are defined to be equal to the width and the type of the left hand side expression.

7. The method of claim 1, further comprising for each ICC expression of the plurality of ICC expressions:

if the ICC expression is nested within a principal ICC expression of the assign statement, passing a left hand side expression of the assign statement to the ICC expression and then recursively pass the left hand side expression to the principal ICC expression at a leaf level of the principal ICC expression of the assign statement.

8. The method of claim 1, further comprising for each ICC expression of the plurality of ICC expressions:

if the ICC expression is a special expression, substituting the ICC expression with a Verilog-compatible expression and assigning the Verilog-compatible expression to a left hand side expression of the assign statement.

9. The method of claim 1, further comprising for each ICC expression of the plurality of ICC expressions:

if the assign statement in which the ICC expression is contained is an edge triggered assign statement, creating an edge triggered always statement into which the ICC expression is placed.

10. The method of claim 9, wherein the assign statement is a positive edge triggered assign statement and the edge triggered always statement is a positive edge always statement.

11. The method of claim 9, wherein the assign statement is a negative edge triggered assign statement and the edge triggered always statement is a negative edge always statement.

12. A computer readable medium containing executable instructions which, when executed in a processing system, causes the system to translate conditional expressions of a non-Verilog hardware description language (HDL) program used to specify a logic design, that are not recognized by Verilog HDL, comprising:

a) for a module of the non-Verilog HDL program containing one or more assign statements having a plurality of IF/CASE/COND (ICC) expressions, instructions for creating a global link list that contains the plurality of IF/CASE/COND (ICC) expressions contained in the one or more assign statements, with each ICC expression of the plurality of ICC expressions of the assign statement having one or more variables;

b) if an ICC expression of the plurality of ICC expressions contained within an assign statement of the plurality of assign statements is part of a conditional or binary operator expression, instructions for creating a globally incremental variable that is representative of a corresponding variable of the ICC expression;

c) instructions for assigning the ICC expression to the globally incremental variable and replacing the ICC expression with the globally incremental variable in the assign statement and in the global link list of the assign statement;

d) repeating b)–c) for each variable of the one or more variables of the ICC expression to generate one or more globally incremental variables in the assign statement and in the global link list that correspond to the one or more variables of the ICC expression;

e) instructions for creating an always statement of the module, with an event expression having one or more members, that is representative of the assign statement and recognized by Verilog HDL by placing the one or more globally incremental variables contained within the global link list of the assign statement as the one or more members of the event expression; and f) instructions for performing synthesis on the always statement by a processor to generate a logic circuit representative of the module of the non-Verilog HDL program.

13. The computer readable medium of claim 12, wherein instructions for creating the globally incremental variable that is representative of the corresponding variable of the ICC expression, further comprises:

b1) if the ICC expression is part of a conditional expression, instructions for defining the globally incremental variable to have one or more characteristics that are equal to one or more characteristics of the corresponding variable; and b2) if the ICC expression is part of a binary operation expression, instructions for defining the globally incremental variable to have one or more characteristics that are equal to one or more characteristics of a left hand side expression of the assign statement.

14. The computer readable medium of claim 13, wherein instructions for defining the globally incremental variable further comprises:

instructions for determining the one or more characteristics of the corresponding variable by looking at a leaf level of the conditional expression that contains the corresponding variable; and instructions for setting the one or more characteristics of the globally incremental variable to be equal to the one or more characteristics of the right hand side of the conditional expression.

15. The computer readable medium of claim 14, wherein the one or more characteristics of the left hand side expression of the binary operation expression include a width and a type and the one or more characteristics of the globally incremental variable are defined to be equal to the width and the type of the left hand side expression.

16. The computer readable medium of claim 12, further comprising for each ICC expression of the plurality of ICC expressions:

if the ICC expression is nested within a principal ICC expression of the assign statement, instructions for passing a left hand side expression of the assign statement to the ICC expression and then recursively pass the left hand side expression to the principal ICC expression at a leaf level of the principal ICC expression of the assign statement.

17. The computer readable medium of claim 12, further comprising for each ICC expression of the plurality of ICC expressions:

if the ICC expression is a special expression, instructions for substituting the ICC expression with a Verilog-compatible expression and assigning the Verilog-compatible expression to a left hand side expression of the assign statement.

18. The computer readable medium of claim 12, further comprising for each ICC expression of the plurality of ICC expressions:

if the assign statement in which the ICC expression is contained is an edge triggered assign statement, instructions for creating an edge triggered always statement into which the ICC expression is placed.

19. A method of translating conditional expressions, of a non-Verilog hardware description language (HDL) program used to specify a logic design, that are not recognized by Verilog HDL, comprising:

a) for a module, of a plurality of modules of the non-Verilog HDL program, containing one or more assign statements having a plurality of IF/CASE/COND (ICC) expressions, creating a global link list that contains the plurality of IF/CASE/COND (ICC) expressions contained in the one or more assign statements, with each ICC expression of the plurality of ICC expressions of the assign statement having one or more variables;

b) if an ICC expression of the plurality of ICC expressions contained within an assign statement of the plurality of assign statements is part of a conditional or binary operator expression, creating a globally incremental variable that is representative of a corresponding variable of the ICC expression;

c) if the ICC expression is part of a conditional expression, defining the globally incremental variable to have one or more characteristics that are equal to one or more characteristics of the corresponding variable;

d) if the ICC expression is part of a binary operation expression, defining the globally incremental variable to have one or more characteristics that are equal to one or more characteristics of a left hand side expression of the assign statement;

e) assigning the ICC expression to the globally incremental variable and replacing the ICC expression with the globally incremental variable in the assign statement and in the global link list of the assign statement;

f) repeating b)–e) for each variable of the one or more variables of the ICC expression to generate one or more globally incremental variables in the assign statement and in the global link list that correspond to the one or more variables of the ICC expression;

g) creating an always statement of the module, with an event expression having one or more members, that is representative of the assign statement and recognized by Verilog HDL by placing the one or more globally incremental variables contained within the global link list of the assign statement as the one or more members of the event expression;

h) repeating a)–g) for each module of the plurality of modules of the non-Verilog HDL program to generate a plurality of always statements, one for each module of the plurality of modules, that are recognized by Verilog HDL; and i) performing synthesis on the plurality of always statements by a processor to generate a logic circuit representative of the plurality of modules of the non-Verilog HDL program.

20. The method of claim 19, wherein the one or more characteristics of the corresponding variable of the ICC expression include a width and a type.

21. The method of claim 19, wherein defining the globally incremental variable further comprises:

determining the one or more characteristics of the corresponding variable by looking at a leaf level of the conditional expression that contains the corresponding variable; and setting the one or more characteristics of the globally incremental variable to be equal to the one or more characteristics of the right hand side of the conditional expression.

22. The method of claim 21, wherein the one or more characteristics of the globally incremental variable include a width and a type.

23. The method of claim 19, wherein the one or more characteristics of the left hand side expression of the conditional expression include a width and a type and the one or more characteristics of the globally incremental variable are defined to be equal to the width and the type of the left hand side expression.

24. The method of claim 19, further comprising for each ICC expression of the plurality of ICC expressions:

if the ICC expression is nested within a principal ICC expression of the assign statement, passing a left hand side expression of the assign statement to the ICC expression and then recursively passing the left hand side expression to the principal ICC expression at a leaf level of the principal ICC expression of the assign statement.

25. The method of claim 19, further comprising for each ICC expression of the plurality of ICC expressions:

if the ICC expression is a special expression, substituting the ICC expression with a Verilog-compatible expression and assigning the Verilog-compatible expression to a left hand side expression of the assign statement.

26. The method of claim 19, further comprising for each ICC expression of the plurality of ICC expressions:

If the assign statement in which the ICC expression is contained is an edge triggered assign statement, creating an edge triggered always statement into which the ICC expression is placed.

27. The method of claim 26, wherein the assign statement is a positive edge triggered assign statement and the edge triggered always statement is a positive edge always statement.

28. The method of claim 26, wherein the assign statement is a negative edge triggered assign statement and the edge triggered always statement is a negative edge always statement.

29. A computer readable medium containing executable instructions which, when executed in a processing system, causes the system to translate conditional expressions of a non-Verilog hardware description language (HDL) program used to specify a logic design, that are not recognized by Verilog HDL, comprising:

a) for a module, of a plurality of modules of the non-Verilog HDL program, containing one or more assign statements having a plurality of IF/CASE/COND (ICC) expressions, instructions for creating a global link list that contains the plurality of IF/CASE/COND (ICC) expressions contained in the one or more assign statements, with each ICC expression of the plurality of ICC expressions of the assign statement having one or more variables;

b) if an ICC expression of the plurality of ICC expressions contained within an assign statement of the plurality of assign statements is part of a conditional or binary operator expression, instructions for creating a globally incremental variable that is representative of a corresponding variable of the ICC expression;

c) if the ICC expression is part of a conditional expression, instructions for defining the globally incremental variable to have one or more characteristics that are equal to one or more characteristics of the corresponding variable;

d) if the ICC expression is part of a binary operation expression, instructions for defining the globally incremental variable to have one or more characteristics that are equal to one or more characteristics of a left hand side expression of the assign statement;

e) instructions for assigning the ICC expression to the globally incremental variable and replacing the ICC expression with the globally incremental variable in the assign statement and in the global link list of the assign statement;

f) repeating b)–e) for each variable of the one or more variables of the ICC expression to generate one or more globally incremental variables in the assign statement and in the global link list that correspond to the one or more variables of the ICC expression;

g) instructions for creating an always statement of the module, with an event expression having one or more members, that is representative of the assign statement and recognized by Verilog HDL by placing the one or more globally incremental variables contained within the global link list of the assign statement as the one or more members of the event expression;

h) instructions for repeating a)–g) for each module of the plurality of modules of the non-Verilog HDL program to generate a plurality of always statements, one for each module of the plurality of modules, that are recognized by Verilog HDL; and i) instructions for performing synthesis on the plurality of always statements by a processor to generate a logic circuit representative of the plurality of modules of the non-Verilog HDL program.

30. The computer readable medium of claim 29, wherein defining the globally incremental variable further comprises:

instructions for determining the one or more characteristics of the corresponding variable by looking at a leaf level of the conditional expression that contains the corresponding variable; and instructions for setting the one or more characteristics of the globally incremental variable to be equal to the one or more characteristics of the right hand side of the conditional expression.

31. The computer readable medium of claim 29, wherein the one or more characteristics of the left hand side expression of the conditional expression include a width and a type and the one or more characteristics of the globally incremental variable are defined to be equal to the width and the type of the left hand side expression.

32. The computer readable medium of claim 29, further comprising for each ICC expression of the plurality of ICC expressions:

if the ICC expression is nested within a principal ICC expression of the assign statement, instructions for passing a left hand side expression of the assign statement to the ICC expression and then recursively passing the left hand side expression to the principal ICC expression at a leaf level of the principal ICC expression of the assign statement.

33. The computer readable medium of claim 29, further comprising for each ICC expression of the plurality of ICC expressions:

if the ICC expression is a special expression, instructions for substituting the ICC expression with a Verilog-compatible expression and assigning the Verilog-compatible expression to a left hand side expression of the assign statement.

34. The computer readable medium of claim 29, further comprising for each ICC expression of the plurality of ICC expressions:

if the assign statement in which the ICC expression is contained is an edge triggered assign statement, instructions for creating an edge triggered always statement into which the ICC expression is placed.

35. A method of translating conditional expressions, of a non-Verilog hardware description language (HDL) program used to specify a logic design, that are not recognized by Verilog HDL, comprising:

a) determining whether an IF/CASE/COND (ICC) expression of a plurality of ICC expressions of the non-Verilog HDL program is a simple ICC expression in a right hand side expression of an assign statement of a module of the non-Verilog HDL program having one or more assign statements and one or more ICC expressions contained within the one or more assign statements;

b) if the ICC expression is a simple ICC expression in the right hand side expression of the assign statement, translating the ICC expression to an IF/CASE Verilog statement and performing synthesis on the IF/CASE Verilog statement by a processor;

c) if the ICC expression is not a simple ICC expression, determining whether the ICC expression is part of a conditional or binary operator expression;

d) if the ICC expression is part of a conditional or binary operator expression, further comprising:

d1) for the module of the non-Verilog HDL program containing the assign statement, creating a global link list that contains the one or more ICC expressions contained in the one or more assign statements of the module, with each ICC expression of the plurality of ICC expressions of the assign statement having one or more variables;

d2) creating a globally incremental variable that is representative of a corresponding variable of the ICC expression;

d3) assigning the ICC expression to the globally incremental variable and replacing the ICC expression with the globally incremental variable in the assign statement and in the global link list of the assign statement;

d4) repeating d2)–d3) for each variable of the one or more variables of the ICC expression to generate one or more globally incremental variables in the assign statement and in the global link list that correspond to the one or more variables of the ICC expression;

d5) creating an always statement of the module, with an event expression having one or more members, that is representative of the assign statement and recognized by Verilog HDL by placing the one or more globally incremental variables contained within the global link list of the assign statement as the one or more members of the event expression; and d6) performing synthesis on the always statement by the processor to generate a logic circuit representative of the module of the non-Verilog HDL program; and e) repeating a)–d) for each ICC expression of the plurality of ICC expressions of the non-Verilog HDL program.

36. The method of claim 35, wherein the ICC expression is a simple ICC expression if the ICC expression is not part of a conditional or binary operator expression.

37. The method of claim 35, wherein translating the ICC expression to the IF/CASE Verilog statement if the ICC expression is a simple ICC expression in the right hand side expression of the assign statement comprises:

if the ICC expression is a simple IF expression, passing a left hand side expression of the assign statement to the IF expression to create an IF Verilog statement;

if the ICC expression is a simple CASE expression, passing the left hand side expression of the assign statement to the CASE expression to create a CASE Verilog statement; and if the ICC expression is not a simple CASE expression but is a CASE expression, further comprising creating a casex Verilog statement if a selector in the CASE expression contains a don't care bit.

38. The method of claim 37, wherein if the ICC expression is a simple COND expression, comprising:

passing the left hand side expression of the assign statement to the COND expression; and creating a special CASE Verilog statement from the COND expression.

39. The method of claim 37, wherein if the ICC expression is not a simple IF expression, a simple CASE expression, or a simple COND expression, assigning bits of the ICC expression that are not ignore bits.

40. The method of claim 35, further comprising for each ICC expression of the plurality of ICC expressions:

if the ICC expression is nested within a principal ICC expression of the assign statement, passing a left hand side expression of the assign statement to the ICC expression and then recursively pass the left hand side expression to the principal ICC expression at a leaf level of the principal ICC expression of the assign statement.

41. The method of claim 35, further comprising for each ICC expression of the plurality of ICC expressions:

if the ICC expression is a special expression, substituting the ICC expression with a Verilog-compatible expression and assigning the Verilog-compatible expression to a left hand side expression of the assign statement.

42. The method of claim 35, further comprising for each ICC expression of the plurality of ICC expressions:

if the assign statement in which the ICC expression is contained is an edge triggered assign statement, creating an edge triggered always statement into which the ICC expression is placed.

43. The method of claim 42, wherein the assign statement is a positive edge triggered assign statement and the edge triggered always statement is a positive edge always statement.

44. The method of claim 42, wherein the assign statement is a negative edge triggered assign statement and the edge triggered always statement is a negative edge always statement.

45. A computer readable medium containing executable instructions which, when executed in a processing system, causes the system to translate conditional expressions of a non-Verilog hardware description language (HDL) program used to specify a logic design, that are not recognized by Verilog HDL, comprising:

a) instructions for determining whether an IF/CASE/COND (ICC) expression of a plurality of ICC expressions of the non-Verilog HDL program is a simple ICC expression in a right hand side expression of an assign statement of a module of the non-Verilog HDL program having one or more assign statements and one or more ICC expressions contained within the one or more assign statements;

b) if the ICC expression is a simple ICC expression in the right hand side expression of the assign statement, instructions for translating the ICC expression to an IF/CASE Verilog statement and performing synthesis on the IF/CASE Verilog statement by a processor;

c) if the ICC expression is not a simple ICC expression, instructions for determining whether the ICC expression is part of a conditional or binary operator expression;

d) if the ICC expression is part of a conditional or binary operator expression, further comprising:

d1) for the module of the non-Verilog HDL program containing the assign statement, instructions for creating a global link list that contains the one or more ICC expressions contained in the one or more assign statements of the module, with each ICC expression of the plurality of ICC expressions of the assign statement having one or more variables;

d2) instructions for creating a globally incremental variable that is representative of a corresponding variable of the ICC expression;

d3) instructions for assigning the ICC expression to the globally incremental variable and replacing the ICC expression with the globally incremental variable in the assign statement and in the global link list of the assign statement;

d4) repeating d2)–d3) for each variable of the one or more variables of the ICC expression to generate one or more globally incremental variables in the assign statement and in the global link list that correspond to the one or more variables of the ICC expression;

d5) instructions for creating an always statement of the module, with an event expression having one or more members, that is representative of the assign statement and recognized by Verilog HDL by placing the one or more globally incremental variables contained within the global link list of the assign statement as the one or more members of the event expression; and d6) instructions for performing synthesis on the always statement by the processor to generate a logic circuit representative of the module of the non-Verilog HDL program; and e) repeating a)–d) for each ICC expression of the plurality of ICC expressions of the non-Verilog HDL program.

46. The computer readable medium of claim 45, wherein the ICC expression is a simple ICC expression if the ICC expression is not part of a conditional or binary operator expression.

47. The computer readable medium of claim 45, wherein translating the ICC expression to the IF/CASE Verilog statement if the ICC expression is a simple ICC expression in the right hand side expression of the assign statement comprises:

if the ICC expression is a simple IF expression, passing a left hand side expression of the assign statement to the IF expression to create an IF Verilog statement;

if the ICC expression is a simple CASE expression, passing the left hand side expression of the assign statement to the CASE expression to create a CASE Verilog statement; and if the ICC expression is not a simple CASE expression but is a CASE expression, further comprising creating a casex Verilog statement if a selector in the CASE expression contains a don't care bit.

48. The computer readable medium of claim 47, wherein if the ICC expression is a simple COND expression, comprising:

passing the left hand side expression of the assign statement to the COND expression; and creating a special CASE Verilog statement from the COND expression.

49. The computer readable medium of claim 47, wherein if the ICC expression is not a simple IF expression, a simple CASE expression, or a simple COND expression, assigning bits of the ICC expression that are not ignore bits.

50. The computer readable medium of claim 45, further comprising for each ICC expression of the plurality of ICC expressions:

if the ICC expression is nested within a principal ICC expression of the assign statement, passing a left hand side expression of the assign statement to the ICC expression and then recursively pass the left hand side expression to the principal ICC expression at a leaf level of the principal ICC expression of the assign statement.

51. The computer readable medium of claim 45, further comprising for each ICC expression of the plurality of ICC expressions:

if the ICC expression is a special expression, substituting the ICC expression with a Verilog-compatible expression and assigning the Verilog-compatible expression to a left hand side expression of the assign statement.

52. The computer readable medium of claim 45, further comprising for each ICC expression of the plurality of ICC expressions:

if the assign statement in which the ICC expression is contained is an edge triggered assign statement, creating an edge triggered always statement into which the ICC expression is placed.

53. A method of translating conditional expressions, of a non-Verilog hardware description language (HDL) program used to specify a logic design, that are not recognized by Verilog HDL, comprising:

a) determining whether an IF/CASE/COND (ICC) expression of a plurality of ICC expressions of the non-Verilog HDL program is a simple ICC expression in a right hand side expression of an assign statement of a module of a plurality of modules of the non-Verilog HDL program having one or more assign statements and one or more ICC expressions contained within the one or more assign statements;

b) if the ICC expression is a simple ICC expression in the right hand side expression of the assign statement, translating the ICC expression to an IF/CASE Verilog statement and performing synthesis on the IF/CASE Verilog statement by a processor;

c) if the ICC expression is not a simple ICC expression, determining whether the ICC expression is part of a conditional or binary operator expression;

d) if the ICC expression is part of a conditional or binary operator expression, further comprising:

d1) for the module of the non-Verilog HDL program containing the assign statement, creating a global link list that contains the one or more ICC expressions contained in the one or more assign statements of the module, with each ICC expression of the plurality of ICC expressions of the assign statement having one or more variables;

d2) creating a globally incremental variable that is representative of a corresponding variable of the ICC expression;

d3) if the ICC expression is part of a conditional expression, defining the globally incremental variable to have one or more characteristics that are equal to one or more characteristics of the corresponding variable;

d4) if the ICC expression is part of a binary operation expression, defining the globally incremental variable to have one or more characteristics that are equal to one or more characteristics of a left hand side expression of the assign statement;

d5) assigning the ICC expression to the globally incremental variable and replacing the ICC expression with the globally incremental variable in the assign statement and in the global link list of the assign statement;

d6) repeating d2)–d5) for each variable of the one or more variables of the ICC expression to generate one or more globally incremental variables in the assign statement and in the global link list that correspond to the one or more variables of the ICC expression;

d7) creating an always statement of the module, with an event expression having one or more members, that is representative of the assign statement and recognized by Verilog HDL by placing the one or more globally incremental variables contained within the global link list of the assign statement as the one or more members of the event expression;

d8) repeating d1)–d7) for each module of the plurality of modules of the non-Verilog HDL program to generate a plurality of always statements, one for each module of the plurality of modules, that are recognized by Verilog HDL; and d9) performing synthesis on the plurality of always statements by the processor to generate a logic circuit representative of the plurality of modules of the non-Verilog HDL program.

e) repeating a)–d) for each ICC expression of the plurality of ICC expressions of the non-Verilog HDL program.

54. The method of claim 53, wherein the ICC expression is a simple ICC expression if the ICC expression is not part of a conditional or binary operator expression.

55. The method of claim 53, wherein translating the ICC expression to the IF/CASE Verilog expression if the ICC expression is a simple ICC expression in the right hand side expression of the assign statement comprises:

if the ICC expression is a simple IF expression, passing a left hand side expression of the assign statement to the IF expression to create an IF Verilog statement;

if the ICC expression is a simple CASE expression, passing the left hand side expression of the assign statement to the CASE expression to create a CASE Verilog statement; and if the ICC expression is a simple COND expression, comprising:
  passing the left hand side expression of the assign statement to the COND expression; and
  creating a special CASE Verilog statement from the COND expression; and if the ICC expression is not a simple IF expression, a simple CASE expression, or a simple COND expression, assigning bits of the ICC expression that are not ignore bits.

56. The method of claim 55, wherein if the ICC expression is not a simple CASE expression but is a CASE expression, further comprising creating a casex Verilog statement if a selector in the CASE expression contains a don't care bit.

57. The method of claim 53, wherein the one or more characteristics of the corresponding variable of the ICC expression include a width and a type.

58. The method of claim 53, wherein defining the globally incremental variable further comprises:
  determining the one or more characteristics of the corresponding variable by looking at a leaf level of the conditional expression that contains the corresponding variable; and
  setting the one or more characteristics of the globally incremental variable to be equal to the one or more characteristics of the right hand side of the conditional expression.

59. The method of claim 58, wherein the one or more characteristics of the globally incremental variable include a width and a type.

60. The method of claim 53, wherein the one or more characteristics of the left hand side expression of the conditional expression include a width and a type and the one or more characteristics of the globally incremental variable are defined to be equal to the width and the type of the left hand side expression.

61. The method of claim 53, further comprising for each ICC expression of the plurality of ICC expressions:
  if the ICC expression is nested within a principal ICC expression of the assign statement, passing a left hand side expression of the assign statement to the ICC expression and then recursively passing the left hand side expression to the principal ICC expression at a leaf level of the principal ICC expression of the assign statement.

62. The method of claim 53, further comprising for each ICC expression of the plurality of ICC expressions:
  if the ICC expression is a special expression, substituting the ICC expression with a Verilog-compatible expression and assigning the Verilog-compatible expression to a left hand side expression of the assign statement.

63. The method of claim 53, further comprising for each ICC expression of the plurality of ICC expressions:
  if the assign statement in which the ICC expression is contained is an edge triggered assign statement, creating an edge triggered always statement into which the ICC expression is placed.

64. The method of claim 63, wherein the assign statement is a positive edge triggered assign statement and the edge triggered always statement is a positive edge always statement.

65. The method of claim 63, wherein the assign statement is a negative edge triggered assign statement and the edge triggered always statement is a negative edge always statement.

66. A computer readable medium containing executable instructions which, when executed in a processing system, causes the system to translate conditional expressions of a non-Verilog hardware description language (HDL) program used to specify a logic design, that are not recognized by Verilog HDL, comprising:

a) instructions for determining whether an IF/CASE/COND (ICC) expression of a plurality of ICC expressions of the non-Verilog HDL program is a simple ICC expression in a right hand side expression of an assign statement of a module of a plurality of modules of the non-Verilog HDL program having one or more assign statements and one or more ICC expressions contained within the one or more assign statements;

b) if the ICC expression is a simple ICC expression in the right hand side expression of the assign statement, instructions for translating the ICC expression to an IF/CASE Verilog statement and performing synthesis on the IF/CASE Verilog statement by a processor;

c) if the ICC expression is not a simple ICC expression, instructions for determining whether the ICC expression is part of a conditional or binary operator expression;

d) if the ICC expression is part of a conditional or binary operator expression, further comprising:
  d1) for the module of the non-Verilog HDL program containing the assign statement, instructions for creating a global link list that contains the one or more ICC expressions contained in the one or more assign statements of the module, with each ICC expression of the plurality of ICC expressions of the assign statement having one or more variables;
  d2) instructions for creating a globally incremental variable that is representative of a corresponding variable of the ICC expression;
  d3) if the ICC expression is part of a conditional expression, instructions for defining the globally incremental variable to have one or more characteristics that are equal to one or more characteristics of the corresponding variable;
  d4) if the ICC expression is part of a binary operation expression, instructions for defining the globally incremental variable to have one or more characteristics that are equal to one or more characteristics of a left hand side expression of the assign statement;
  d5) instructions for assigning the ICC expression to the globally incremental variable and replacing the ICC expression with the globally incremental variable in the assign statement and in the global link list of the assign statement;
  d6) repeating d2)–d5) for each variable of the one or more variables of the ICC expression to generate one or more globally incremental variables in the assign statement and in the global link list that correspond to the one or more variables of the ICC expression;
  d7) instructions for creating an always statement of the module, with an event expression having one or more members, that is representative of the assign statement and recognized by Verilog HDL by placing the one or more globally incremental variables contained within the global link list of the assign statement as the one or more members of the event expression;
  d8) repeating d1)–d7) for each module of the plurality of modules of the non-Verilog HDL program to generate a plurality of always statements, one for each module of the plurality of modules, that are recognized by Verilog HDL; and d9) instructions for performing synthesis on the plurality of always statements by the processor to generate a logic circuit representative of the plurality of modules of the non-Verilog HDL program.

e) repeating a)–d) for each ICC expression of the plurality of ICC expressions of the non-Verilog HDL program.

67. The computer readable medium of claim 66, wherein the ICC expression is a simple ICC expression if the ICC expression is not part of a conditional or binary operator expression.

68. The computer readable medium of claim 66, wherein translating the ICC expression to the IF/CASE Verilog expression if the ICC expression is a simple ICC expression in the right hand side expression of the assign statement comprises:

if the ICC expression is a simple IF expression, instructions for passing a left hand side expression of the assign statement to the IF expression to create an IF Verilog statement;

if the ICC expression is a simple CASE expression, instructions for passing the left hand side expression of the assign statement to the CASE expression to create a CASE Verilog statement; and if the ICC expression is a simple COND expression, comprising:
   instructions for passing the left hand side expression of the assign statement to the COND expression; and
   instructions for creating a special CASE Verilog statement from the COND expression; and if the ICC expression is not a simple IF expression, a simple CASE expression, or a simple COND expression, instructions for assigning bits of the ICC expression that are not ignore bits.

69. The computer readable medium of claim 68, wherein if the ICC expression is not a simple CASE expression but is a CASE expression, further comprising instructions for creating a casex Verilog statement if a selector in the CASE expression contains a don't care bit.

70. The computer readable medium of claim 66, wherein defining the globally incremental variable further comprises:

instructions for determining the one or more characteristics of the corresponding variable by looking at a leaf level of the conditional expression that contains the corresponding variable; and instructions for setting the one or more characteristics of the globally incremental variable to be equal to the one or more characteristics of the right hand side of the conditional expression.

71. The computer readable medium of claim 66, wherein the one or more characteristics of the left hand side expression of the conditional expression include a width and a type and the one or more characteristics of the globally incremental variable are defined to be equal to the width and the type of the left hand side expression.

72. The computer readable medium of claim 66, further comprising for each ICC expression of the plurality of ICC expressions:

if the ICC expression is nested within a principal ICC expression of the assign statement, instructions for passing a left hand side expression of the assign statement to the ICC expression and then recursively passing the left hand side expression to the principal ICC expression at a leaf level of the principal ICC expression of the assign statement.

73. The computer readable medium of claim 66, further comprising for each ICC expression of the plurality of ICC expressions:

if the ICC expression is a special expression, instructions for substituting the ICC expression with a Verilog-compatible expression and assigning the Verilog-compatible expression to a left hand side expression of the assign statement.

74. The computer readable medium of claim 66, further comprising for each ICC expression of the plurality of ICC expressions:

if the assign statement in which the ICC expression is contained is an edge triggered assign statement, instructions for creating an edge triggered always statement into which the ICC expression is placed.

* * * * *